United States Patent
Krause et al.

(10) Patent No.: US 8,278,652 B2
(45) Date of Patent: Oct. 2, 2012

(54) SEMICONDUCTOR MATERIAL FOR AN ORGANIC DIODE

(75) Inventors: Ralf Krause, Erlangen (DE); Günter Schmid, Hemhofen (DE)

(73) Assignee: Siemens Aktiengesellschaft, Munich (DE)

( * ) Notice: Subject to any disclaimer, the term of this patent is extended or adjusted under 35 U.S.C. 154(b) by 263 days.

(21) Appl. No.: 12/665,388

(22) PCT Filed: Jun. 16, 2008

(86) PCT No.: PCT/EP2008/057540
§ 371 (c)(1),
(2), (4) Date: May 21, 2010

(87) PCT Pub. No.: WO2008/155310
PCT Pub. Date: Dec. 24, 2008

(65) Prior Publication Data
US 2010/0243998 A1  Sep. 30, 2010

(30) Foreign Application Priority Data
Jun. 20, 2007 (DE) .......... 10 2007 028 236

(51) Int. Cl.
*H01L 29/08* (2006.01)
*H01L 35/24* (2006.01)
*H01L 51/00* (2006.01)

(52) U.S. Cl. .......... 257/40; 257/E51.001; 257/E51.003; 257/E51.008; 257/E51.025

(58) Field of Classification Search .......... 257/40, 257/E51.001, E51.003, E51.008, E51.025
See application file for complete search history.

(56) References Cited

U.S. PATENT DOCUMENTS

| | | | |
|---|---|---|---|
| 6,352,954 B1 * | 3/2002 | Kobayashi | 502/159 |
| 6,605,904 B2 * | 8/2003 | Jenekhe et al. | 315/169.3 |
| 6,947,321 B2 * | 9/2005 | Tanabe | 365/174 |
| 7,540,978 B2 * | 6/2009 | Pfeiffer et al. | 252/500 |
| 8,134,146 B2 * | 3/2012 | Limmert et al. | 257/40 |
| 2004/0241492 A1 | 12/2004 | Nomura | |
| 2005/0217722 A1 * | 10/2005 | Komatsu et al. | 136/263 |
| 2007/0033747 A1 * | 2/2007 | Chianelli et al. | 8/498 |
| 2010/0044683 A1 * | 2/2010 | Zeika et al. | 257/40 |

FOREIGN PATENT DOCUMENTS

| | | |
|---|---|---|
| DE | 10044842 A | 4/2002 |
| EP | 1289030 A | 3/2003 |
| EP | 1359830 A | 11/2003 |
| EP | 1860709 A | 11/2007 |
| JP | 3208689 A | 9/1991 |
| WO | WO 0103126 A2 | 1/2001 |

(Continued)

OTHER PUBLICATIONS

F. Albert Cotton, et al., "Closed-Shell Molecules That Ionize More Readily Than Cesium", Science, vol. 298, pp. 1971-1974, Dec. 6, 2002.

(Continued)

*Primary Examiner* — Ida M Soward
(74) *Attorney, Agent, or Firm* — King & Spalding L.L.P.

(57) ABSTRACT

A semiconductor material and an organic rectifier diode can be used for organic-based RFID (Radio Frequency Identification) tags. The semiconducting material for an organic diode has a metal complex as a p-dopant for doping a hole-conducting organic matrix material, wherein the metal complex is a metal complex with Lewis acid properties, which acts as an electron pair acceptor.

11 Claims, 4 Drawing Sheets

FOREIGN PATENT DOCUMENTS

| | | |
|---|---|---|
| WO | WO 2005036667 A | 4/2005 |
| WO | WO 2005043583 A2 | 5/2005 |
| WO | WO 2005086251 A | 9/2005 |

OTHER PUBLICATIONS

F. Albert Cotton, et al., "Studies of Tetrakis (trifluoroacetate) Dirhodium. 2. A Pi Complex of Hexamethylbenzene with Tetrakis (trifluoroacetale) Dirhodium (II,II)", Organometallics, 1999, 18, pp. 2724-2726, Mar. 18, 1999.

F. Albert Cotton, et al., "Supramolecular Assemblies of Dimetal Complexes with Polydentate N-Donor Ligands: Fro a Discrete Pyramid to a 3D Channel Network", Inorganic Chemistry, vol. 14, No. 11, pp. 2903-2908, 2002.

F. Albert Cotton, et al., "Studies of Dirhodium (II) Tetrakis (trifluoroacetate). 6. The First Structural Characterization of Axial Alkyne Complexes, Rh2 (OxCCF3)4(Ph2C2)n (n=1, 2): Diphenylacetylene as a Bifunctional Ligand". Organometallics. 2000, pp. 1402-1405, Dec. 10, 1999.

F. Albert Cotton, et al., "Studies of Dirhodium (II) tetrakis (trifluoroacetate). Part 8. One-dimensional Polymers of RH2(O2CCF3)4 with Aromatic Ligands: Benzene, p-xylene and Naphthalene". Plyhedron 19, 2000, pp. 1829-1835. May 30, 2000.

Kazuo Yamashita, et al., "Fabrication of an Organic p-n Homojunction Diode using Electrochemically Cation- and Photochemically Anion-Doped Polymer", Japanese Journal of Applied Physics, vol. 34, part 1, No. 7B, pp. 3794-3797, Jul. 1995, XP-000703013.

International PCT Search Report, PCT/EP2008/057540, 4 pages, Jun. 16, 2008.

* cited by examiner

---- 150 nm NBP
—— 150 nm NBP:PDW2 [1%]
—— 150 nm NBP:PDW2 [5%]
—— 150 nm NBP:PDW2 [10%]
—— 70 nm pure PDW2

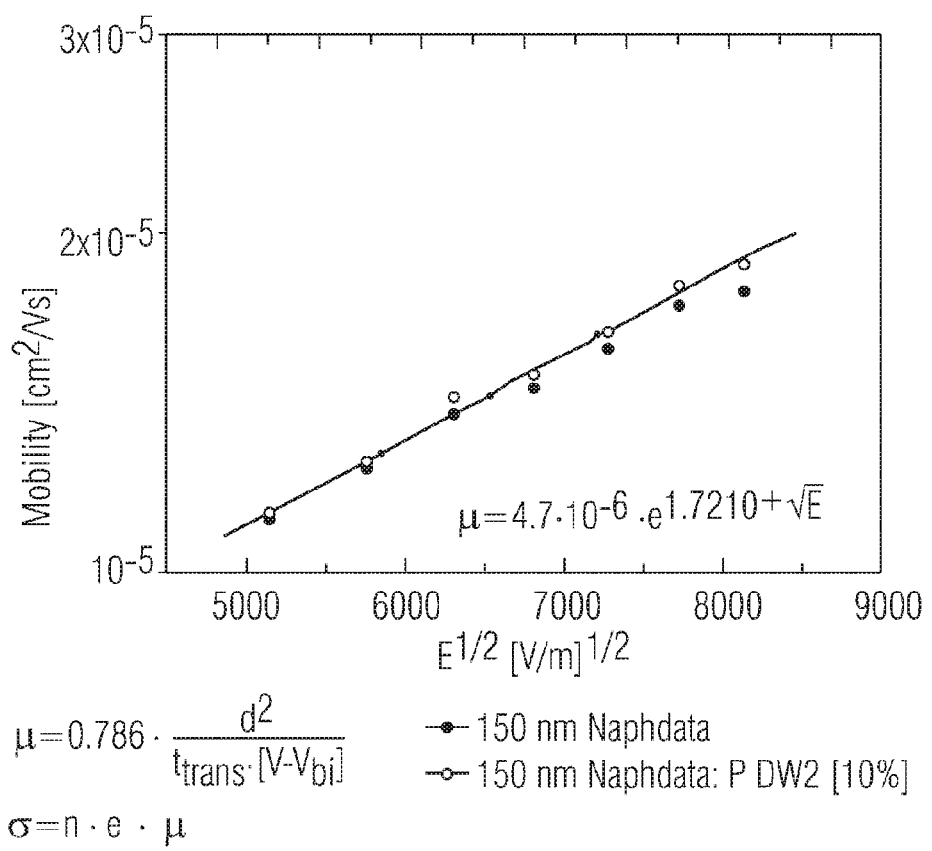

SEMICONDUCTOR MATERIAL FOR AN ORGANIC DIODE

CROSS-REFERENCE TO RELATED APPLICATIONS

This application is a U.S. National Stage Application of International Application No. PCT/EP2008/057540 filed Jun. 16, 2008, which designates the United States of America, and claims priority to German Application No. 10 2007 028 236.4 filed Jun. 20, 2007, the contents of which are hereby incorporated by reference in their entirety.

TECHNICAL FIELD

The invention relates to a semiconductor material and an organic rectifier diode, such as is used for organic-based RFID (Radio Frequency Identification) tags.

BACKGROUND

Circuits based on organic semiconductors are of interest for a number of electronic applications which require low production costs, flexible or infrangible substrates, or require the production of components over large active surfaces. For example, organic electronics are suitable for the production of extremely inexpensive integrated circuits, such as for example are used for the active marking and identification of products and goods.

Passive RFID systems take their energy from the irradiated alternating field. The possible distance between the reader and transponder in this case depends on the emitted power and the energy demand of the transponder. Products which contain a silicon-based chip are too expensive for many applications. For example, a silicon-based identification tag is out of the question for the identification of foodstuffs (price, expiry date, etc.).

Polymers and/or organic semiconductors on the other hand offer the potential of being able to use cheap printing techniques for their structuring and application.

To make the carrier frequency of the RFID system usable for power supply, the power supply must be rectified. In a simplest case a diode (half-wave rectification) and for more complex applications several diodes are used (2 diodes: full-wave circuit with center tap of the transformer; 4 diodes: Graetz circuit). A rectifier can thus be only a single diode, contain several diodes and/or additionally have a capacitor.

From DE 10044842 an organic rectifier, an organic-based circuit, RFID tag and use of an organic rectifier are known. In the organic rectifier described therein, at least one of the p/n-doped conductive layers of a conventional p/n semiconductor diode is supplemented and/or replaced by an organic conductive material. Equally, with a conventional metal/semiconductor diode (Schottky diode) at least one layer can be replaced by an organic layer.

The organic rectifier consists at least of two layers, but for optimization can also consist of further layers (e.g. for matching the work function). Thus, for example, an undoped semiconductor layer can be inserted, which reduces the capacitance and thus enables higher frequencies.

In this case, the organic semiconductor material is matched to the conductive material so that the structure of the rectifier produces a typical diode curve when a voltage is applied, with the current flowing only in one direction and being largely blocked in the other direction.

An example of a construction of a rectifier diode includes a first electric line through which the alternating current reaches the cathode. From the cathode, if there is positive voltage, electrons reach the conductor material and from there enter the organic semiconducting material and reach the anode through the second conductor material layer. The second electric line then carries the electrons. In the case of negative voltage, the rectifier closes and the semiconducting material blocks the current flow. Alternatively, there is the Schottky diode, as it is called, which in the simplest case includes only a metal layer and a semiconducting layer.

There is a requirement for an organic semiconducting material which produces a diode curve in a diode construction and at the same time has a high current carrying capacity with inherent current limiting.

SUMMARY

According to various embodiments a semiconducting organic material can be created which produces a diode curve in a diode construction, with the material having at least one hole-conducting matrix in which a metal complex is embedded.

According to an embodiment, a semiconducting material for an organic diode may comprise a metal complex as a p-dopant for doping a hole-conducting organic matrix material, with the metal complex being a metal complex with Lewis acid properties, which acts as an electron pair acceptor. According to a further embodiment, the metal complex can be a multi-core metal complex. According to a further embodiment, the central atom of the metal complex can be a neutral or charged transition metal atom. According to a further embodiment, at least one central atom of the metal complex can be chosen from the platinum group containing the following elements: ruthenium, rhodium, palladium, osmium, iridium and platinum. According to a further embodiment, at least one central atom of the metal complex can be rhodium. According to a further embodiment, the metal complex can be a multicore metal complex, with which at least one ligand coordinatively connects two central atoms. According to a further embodiment, at least one central atom can be surrounded, in a quadratic planar fashion, by ligands. According to a further embodiment, the metal complex can be of multicore, symmetrical construction. According to a further embodiment, the ligands can be carboxylic acids or carboxylic acid anions with electron-attracting substituents. According to a further embodiment, at least one metal complex may have a paddlewheel structure. According to a further embodiment, the molar doping ratio of p-dopant to monomer units of a polymer hole-conducting matrix molecule can be between 1:1 and 1:100.000.

According to another embodiment, an organic rectifier diode, may comprise an electronic functionally effective semiconducting area, with the electronic, functionally effective area being produced using at least one or more semiconducting materials as described above.

According to a further embodiment, the diode can be part of an organic integrated circuit.

BRIEF DESCRIPTION OF THE DRAWINGS

FIG. 6 shows characteristic curves of organic light-emitting diodes according to various embodiments.

DETAILED DESCRIPTION

Figure 1:
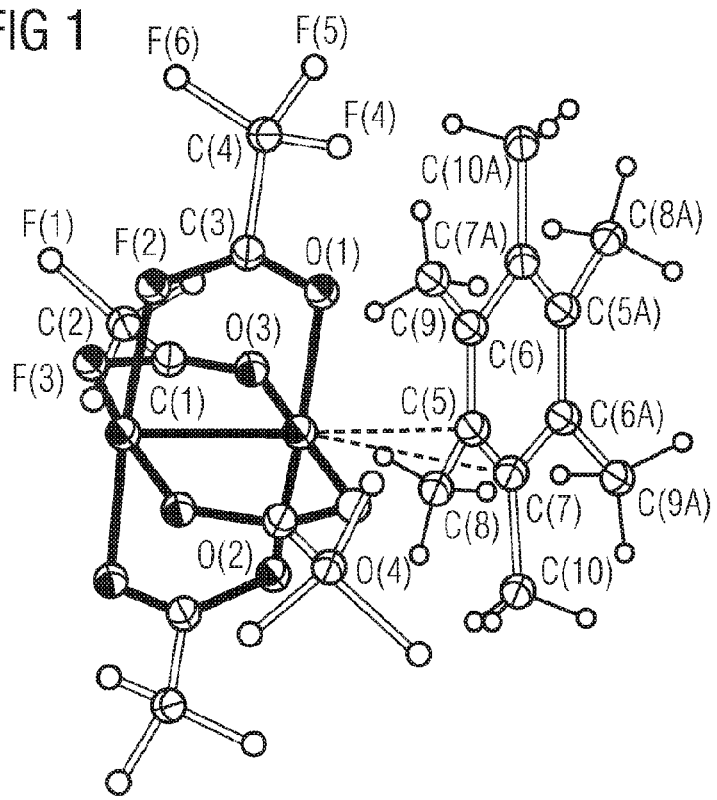
FIG. 1 shows the structure of a crystal according to an embodiment.

For example indium tin oxide (ITO) and gold, and basically also all noble metals and alloys thereof, are suitable as cathodes or electrodes with high work functions. Instead of the named materials, other materials with high work functions, such as silver, platinum, palladium (noble metals in general) or also organic conductors such as polystyrene sulfonic acid-doped polydiethoxythiophene (PEDOT:PSS) or doped polyaniline (PANI) can however also used.

Aluminum, magnesium and any alloys or other base metals are suitable as anodes or electrodes with a low work function. In addition to aluminum, other base metals are suitable as the second electrode, especially Ti, Mo, Al—Mg alloys, Ca, lathanoids Sm, Y, alkaline-earth metals, Ca, Mg, Sr, Ba, as well as any mixtures and/or alloys thereof.

As a hole conducting matrix, many other known hole-conducting materials such as NPB; naphdata; N,N'-bis(naphthalen-1-yl)-N,N'-bis(phenyl)-benzidine; N,N'-bis(naphthalene-2-yl)-N,N'-bis(phenyl)-benzidine; N,N'-bis(3-methylphenyl)-N,N'-bis(phenyl)-benzidine; N,N'-bis(3-methylphenyl)-N,N'-bis(phenyl)-9,9-spirobifluorene; N,N'-bis(naphthalene-1-yl)-N,N'-bis(phenyl)-9,9-spirobifluorene; N,N'-bis(3-methylphenyl)-N,N'-bis(phenyl)-9,9-dimethyl-fluorene; N,N'-bis(3-naphthalene-1-yl)-N,N'-bis(phenyl)-9,9-dimethyl-fluorene; N,N'-bis(3-methylphenyl)-N,N'-bis(phenyl)9,9-diphenyl-fluorene; N,N'-bis(3-naphthalene-1-yl)-N,N'-bis(phenyl)-9,9-diphenyl-fluorene; 2,2',7,7'-tetrakis(N,N-diphenylamino)-9,9'-spirobifluorene; 9,9-bis[4-(N,N-bis-biphenyl-4-yl-amino)phenyl]-9H-fluorene; 9,9-bis[4-(N,N-bis-naphthalene-2-yl-amino)phenyl]-9H-fluorene; 9,9-bis[4-(N,N'-bis-naphthalene-2-yl-N,N'-bis-phenyl-amino)-phenyl]-9H-fluorene; 2,2',7,7'-tetrakis[(N-naphthalenyl(phenyl)-amino]9,9-spirobifluorene; N,N'-bis(phenanthren-9-yl)-N,N'-bis(phenyl)-benzidine; 2,7-bis[N,N-bis(9,9-spiro-bifluorene-2-yl)-amino]-9,9-spirobifluorene; 2,2'-bis[N,N-bis(biphenyl-4-yl)amino]-9,9-spirobifluorene; 2,2'-bis(N,N-di-phenylamino)-9,9-spirobifluorene; phthalocyanine-copper complex; 4,4',4"-tris(N-3-methylphenyl-N-phenyl-amino)triphenylamine; 4,4',4"-tris(N-(2-naphthyl)-N-phenyl-amino)triphenylamine; 4,4',4"-tris(N-(1-naphthyl)-N-phenyl-amino)triphenylamine; 4,4',4"-tris(N,N-diphenyl-amino)triphenylamine; titanium oxide phthalocyanine; 2,3,5,6-tetrafluoro-7,7,8,8,-tetracyanoquinodimethane; pyrazino[2,3-f][1,10]phenanthrolone-2,3-dicarbonitrile; N,N,N',N'-tetrakis(4-methoxyphenyl)benzidine; 2,7-bis[N,N-bis(4-methoxy-phenyl)amino]-9,9-spirobifluorene; 2,2'-bis[N,N-bis(4-methoxyphenyl)amino]-9,9-spirobifluorene; 1,3-bis(carbazol-9-yl)benzene; 1,3,5-tris(carbazol-9-yl)benzene; 4,4',4"-tris(carbazol-9-yl)triphenylamine; 4,4'-bis(carbazol-9-yl)biphenyl; 4,4'-bis(9-carbazolyl)-2,2'-dimethyl-biphenyl; 2,7-bis(carbazol-9-yl)-9,9-dimentylfluorene and 2,2',7,7'-tetrakis(carbazol-9-yl)-9,9'-spirobifluorene are suitable.

Dirhodiumtetratrifluoracetate is particularly suitable as a dopant, because it is very good for vacuum deposition due to its very favorable sublimation characteristics. Unsurprisingly, the chemical literature also shows that with respect to crystallography even unsubstituted aromatics can serve as a donor for the $RH_2^{4+}$ core in the axial position and thus have the effect of p-doping by charge draw-off.

FIG. 1 shows the structure of a crystal of this compound, taken using X-ray crystallography, where the $RH_2(CF_3COO)_4$ is coordinated with the hexamethylbenzole aromatic system.

Also the isoelectronic metal complexes of this structure, especially those which still have similar sizes as, for example, an analog with $RU_2^{2+}$ ions as central atoms, are also suitable as p-dopants for the hole-conducting matrix according to various embodiments. On the one hand, this produces the paddlewheel structure and on the other hand results in the very high Lewis acid acidity of these complexes. Those that can coordinate with the aromatic systems are particularly suitable.

Figure 4:
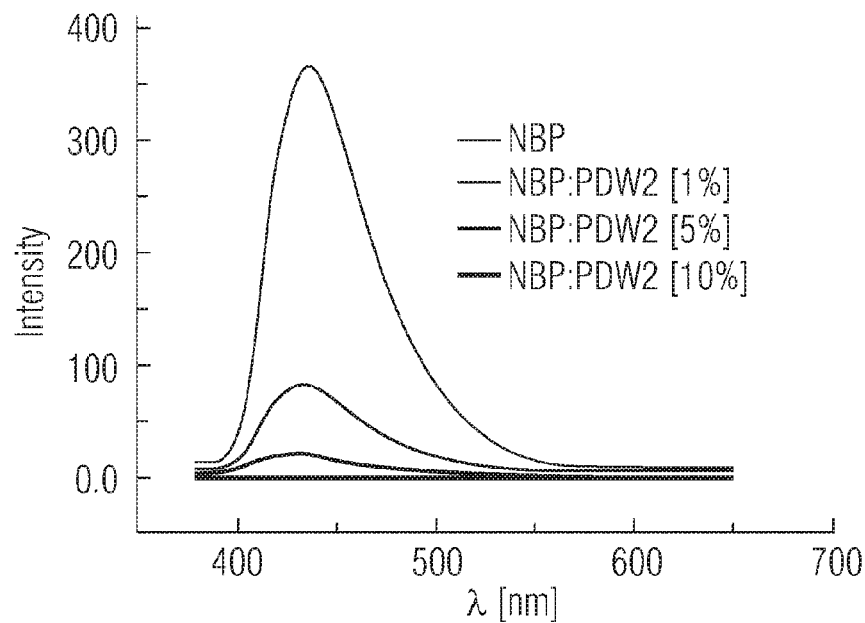

With a "paddlewheel complex", two metal central atoms, especially transition-metal atoms are bridged by, preferably two but possible also three, four or polydentate ligands, which in each case bind a ligand atom to both metal central atoms. The metal atoms in this case are, depending on the radius, coordinated mostly four times, or also five times or more, with the Lewis acid character also being produced by this, so that at least one loose or empty coordination point is present at which, for example, the attachment of an aromatic ring, as shown in FIG. 4, can take place. The coordination environment of the metal atom is preferred so that a metal-metal bond exists, four equatorial bonds and an axial bond, which has a Lewis acidity depending on the ligand and central atom.

Basically, bidentate or polydentate, preferably electron-attracting, ligands are suitable as ligands. For example, the anions of electron-attracting carbolyxic acids, such as $CHal_xH_{3-x}COOH$, especially $CF_xH_{3-x}COOH$ and $CCl_xH_{3-x}COOH$, $(CR_1,R_2,R_3)COOH$, it being possible for R1, R2 and R3 to be alkyls independent of each other such as, particularly preferred, H, methyl, ethyl, propyl, isopropyl; n-, sec-, tert-butyl, benzoic acids and their substituted analogs (o,p,m-fluorbenzoic acid, o,p,m-cyanobenzoic acid, nitrobenzoic acid, fluorinated or partially fluorinated alkyl benzoic acids, polysubstituted or monosubstituted if necessary, pyridine carboxylic acids, etc.).

The metal complexes used according to various embodiments preferably represent molecules which can be volatized independent of each other. It is understand that individual metal complexes can in each case be bonded with each other or with other components such as the matrix material.

From a purely technical point of view, the valence electrons of the PDW-2 can be calculated as follows.

In group IX with 4 single negatively charged bidentate ligands we get the following pattern for metal-metal:
4×4e=16 electrons from the ligands
1×2e=8 from the single bond between Rh—Rh
2×9e=12 from rhodium
Total 36, therefore each Rh has a noble gas configuration, i.e. is stable
or
Group 6: Metal-metal quadruple bond, i.e. σ, 2×π, 1×δ bond, occupied
Group 7: Metal-metal triple bond i.e. σ, 2×π, 1×δ bond 1×δ* occupied
Group 8: Metal-metal double bond, i.e. σ, 2×π, 1×δ bond, 1×δ*, 1×π* occupied
Group 8: Metal-metal double bond i.e. σ, 2×π, 1×δ bond, 1×δ*, 1×π* occupied
Group 9: Metal-metal single bond, i.e. σ, 2×π, 1×δ bond, 1×δ*, 2×π* occupied In this case, it is understood that individual metal complexes can be bonded in each case with each other or with other components such as the matrix material. The dopants are fixed in the matrix by the formation of the bond of the donor-acceptor interaction and the molecule size.

The experimentally found current limiting has up until now remained unrecognized in any of the published material systems suitable for doping. For RFID applications, this layer has the advantage that the circuit is not excessively loaded in the near field of the transmitter because the inherent current limiting is effective.

The current carrying capacity of organic Schottky diodes is increased by several orders of magnitude by the use of a doped semiconductor layer. Undoped systems are prior art. The presented material combination furthermore shows unexpected current limiting.

The invention is explained in more detail in the following with the aid of examples:

EXAMPLE 1

Figure 2:
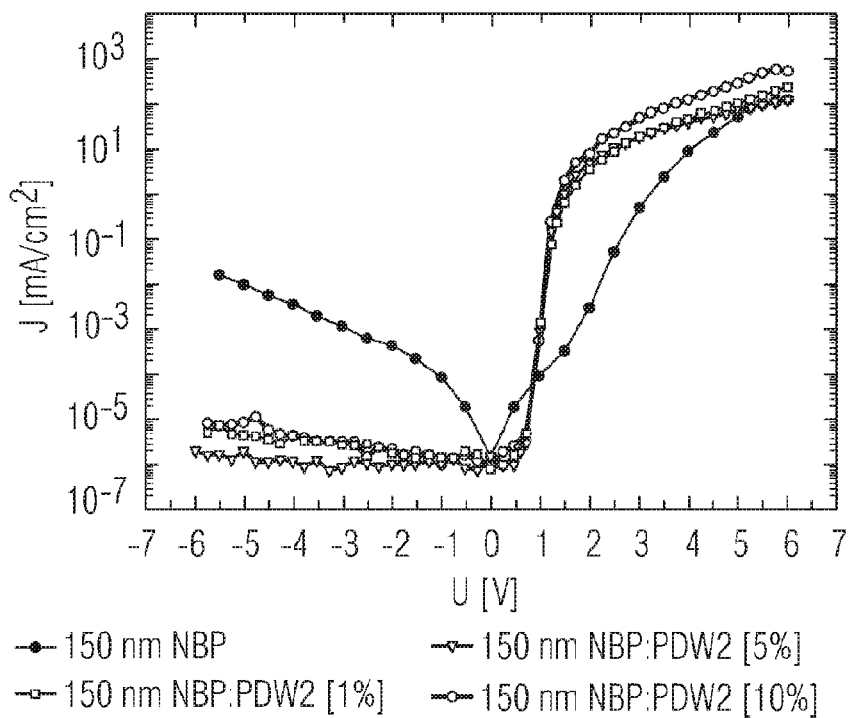
FIG. 2 shows a typical characteristic curve of various embodiments.
Figure 3:
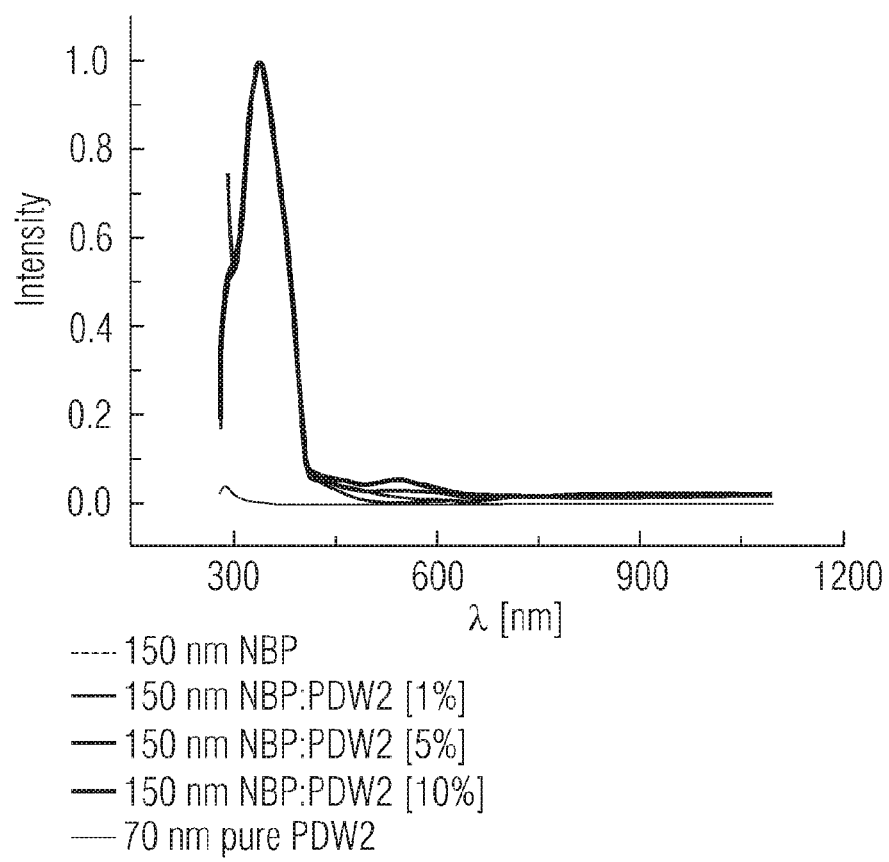
FIG. 3-4 shows the photoluminescence spectrum of the layers of various embodiments.
Figure 3:
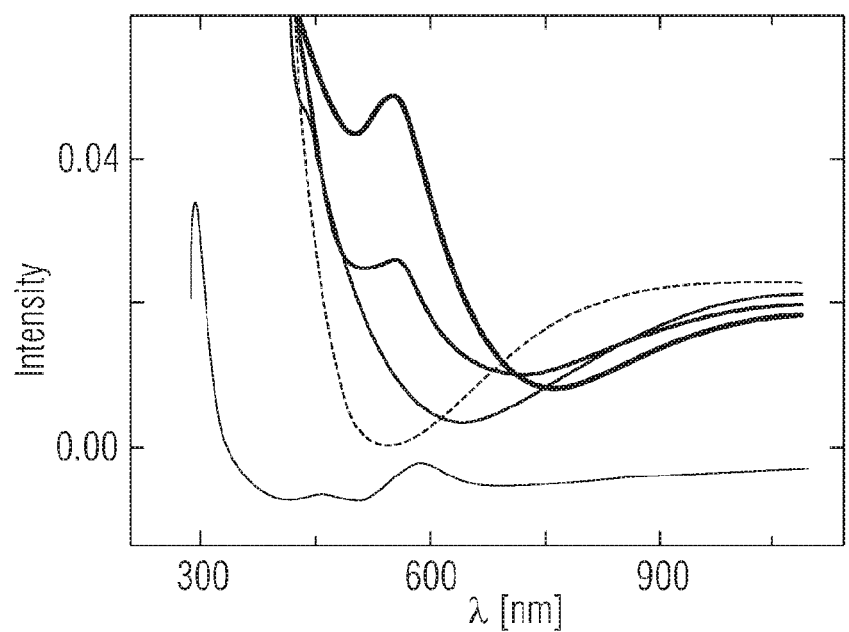

A 150 nm thick layer of the electron conductor NPB (=bis-N,N,N',N'-(naphthyl-phenyl)benzidine was deposited on an ITO (indium-tin-oxide=indium doped tin oxide) electrode by thermal vaporization. A 150 nm thick aluminum layer served as counter-electrodes. A 4 mm$^2$ component produced the typical characteristic curved marked by black circles, as shown in FIG. 2.

In a second experiment, PDW-2 (=dirhodiumtetrafluoracetate) was doped by Kover evaporation into the hole conductor NPB (=bis-N,N,N',N'-(naphythyl-phenyl)benzidine. The characteristic curves, also shown in FIG. 2, were obtained for a doping of 0% (black), 1% (red), 5% (green) and 10% (blue).

These clearly demonstrate the possibility of doping hole-conducting matrix material by PDW-2. Astonishingly, no holes can be injected from aluminum (negative branch of the x axis), thus producing a rectification factor of $3 \cdot 10^{-7}$. Layer thickness of only a few percentage points is sufficient for an effective doping. The characteristic curves between 1-10% PDW-2 in NPB are virtually identical. The characteristic curves are furthermore very steep. At higher voltages the characteristic curve saturates, thus resulting in a current-limiting behavior.

EXAMPLE 2

An additional band in the UV spectrum in the 550-600 nm range shows the doping capacity of NPB by PDW-2.

EXAMPLE 3

FIG. 4 shows the photoluminescence spectrum of the layers shown in example 3. When the layer is excited with UV light of 342 nm, the fluorescence of the NPB layer steadily decreases. Completely in accordance with other dopants, PDW-2 also extinguishes the fluorescence.

EXAMPLE 4

Figure 5:
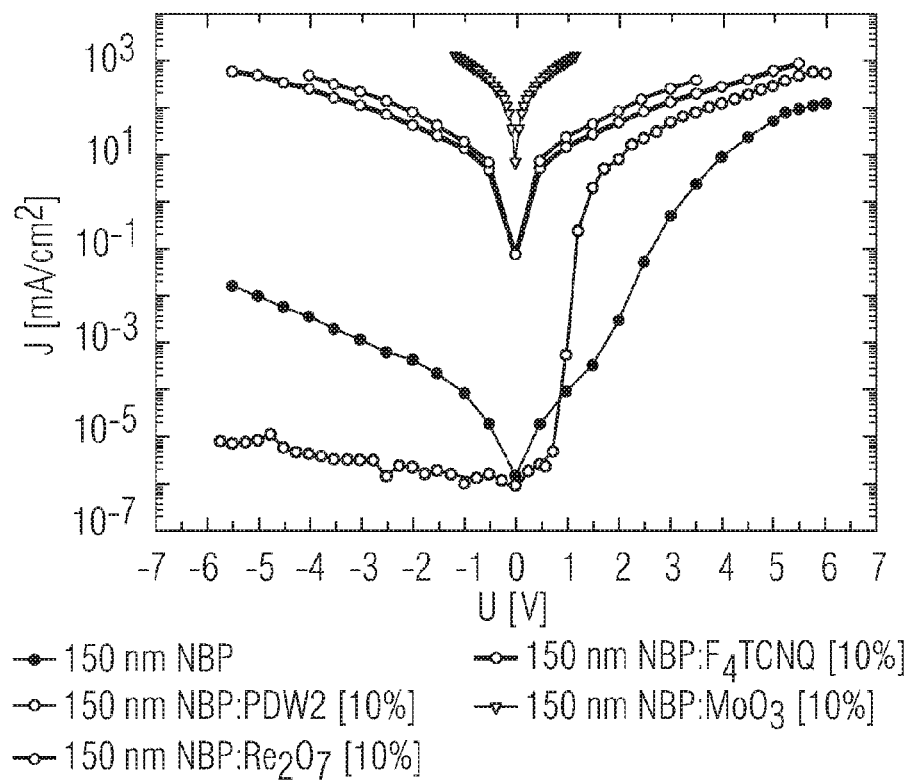
FIG. 5 shows characteristic curves of examples with other dopants.

Other dopants known from literature, such as $MoO_2$, $F_4TCNQ$, $Re_2O_7$ show no rectifying effect in the same arrangement, as shown in FIG. 5.

EXAMPLE 5

The charge carrier density can also be increased in other hole conductors, such as naphdata, by the dopant PDW-2 (naphdata=4,4',4"-tris((N-naphthyl)-N-phenyl-amino)-triphenylamine).

Transient dark current measurements show that at a doping of 10% PDW-2 in naphdata the mobility remains virtually constant. As demonstrated in FIG. 6, the charge carrier density available for the organic light emitting diode increases strongly, which has a very positive effect on the characteristic curves of organic light-emitting diodes. ($\sigma$=conductivity, $\mu$=mobility, n=number of load carriers, e=elementary charging)

The invention is characterized particularly by the fact that the materials used are compatible with the basic materials of organic electronic components and that, for example, in the preferred two-core metal complexes with the metal-metal bond the charge is formally distributed during current transport in the molecule to two metal atoms, which contributes to the stability of the complete layer.

The invention relates to a semiconductor material and an organic rectifier diode, such as, for example is used for organically-based RFID (Radio Frequency Identification Tags).

What is claimed is:

1. A semiconducting material for an organic diode comprising a metal complex as a p-dopant for doping a hole-conducting organic matrix material, wherein the metal complex is a metal complex with Lewis acid properties which acts as an electron pair acceptor.

2. The semiconducting material according to claim 1, wherein the metal complex is a multi-core metal complex.

3. The semiconducting material according to claim 1, wherein the central atom of the metal complex is a neutral or charged transition metal atom.

4. The semiconducting material according to claim 1, wherein at least one central atom of the metal complex is chosen from the platinum group consisting of: ruthenium, rhodium, palladium, osmium, iridium and platinum.

5. The semiconducting material according to claim 1, wherein at least one central atom of the metal complex is rhodium.

6. The semiconducting material according to claim 1, wherein the metal complex is a multicore metal complex, with which at least one ligand coordinatively connects two central atoms.

7. The semiconducting material according to claim 1, wherein at least one central atom is surrounded, in a quadratic planar fashion, by ligands.

8. The semiconducting material according to claim 1, wherein the metal complex is of multicore, symmetrical construction.

9. The semiconducting material according to claim 1, wherein the ligands being carboxylic acids or carboxylic acid anions with electron-attracting substituents.

10. The semiconducting material according to claim 1, wherein at least one metal complex has a paddlewheel structure.

11. The semiconducting material according to claim 10, wherein the molar doping ratio of p-dopant to monomer units of a polymer hole-conducting matrix molecule is between 1:1 and 1:100.000.

* * * * *